United States Patent
Park et al.

(10) Patent No.: US 11,573,492 B2
(45) Date of Patent: Feb. 7, 2023

(54) PHOTORESIST COMPOSITION

(71) Applicant: LG CHEM, LTD., Seoul (KR)

(72) Inventors: Hyun Min Park, Daejeon (KR); Minyoung Lim, Daejeon (KR); Tae Seob Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 372 days.

(21) Appl. No.: 16/631,765

(22) PCT Filed: Jul. 24, 2018

(86) PCT No.: PCT/KR2018/008366
§ 371 (c)(1),
(2) Date: Jan. 16, 2020

(87) PCT Pub. No.: WO2019/098493
PCT Pub. Date: May 23, 2019

(65) Prior Publication Data
US 2020/0218153 A1 Jul. 9, 2020

(30) Foreign Application Priority Data

Nov. 14, 2017 (KR) .................. 10-2017-0151809
Jul. 23, 2018 (KR) .................. 10-2018-0085444

(51) Int. Cl.
*G03F 7/039* (2006.01)
*C08F 20/38* (2006.01)
(Continued)

(52) U.S. Cl.
CPC ............ *G03F 7/0392* (2013.01); *C08F 20/38* (2013.01); *G03F 7/0045* (2013.01); *G03F 7/20* (2013.01)

(58) Field of Classification Search
CPC ........ G03F 7/0392; G03F 7/0045; G03F 7/20; G03F 7/0397; G03F 7/2059;
(Continued)

(56) References Cited

U.S. PATENT DOCUMENTS 6,639,035 B1 10/2003 Chen et al.
10,286,421 B2 5/2019 Suzuki et al.
(Continued)

FOREIGN PATENT DOCUMENTS

EP 2848659 A1 * 3/2015 ........... C09D 11/322
JP H07-219241 A 8/1995
(Continued)

OTHER PUBLICATIONS

English Translation of JP 2005-091618 A; Kazuto Kunida; Published: Apr. 7, 2005 (Year: 2005).*
(Continued)

*Primary Examiner* — Peter L Vajda
*Assistant Examiner* — Richard David Champion
(74) *Attorney, Agent, or Firm* — Rothwell, Figg, Ernst & Manbeck. P.C.

(57) ABSTRACT

The present invention relates to a chemically amplified photoresist composition including an alkali-soluble resin including a (meth)acrylate-based resin containing a (meth)acrylate-based repeating unit in which a heterocyclic compound is substituted via a divalent functional group containing an alkylene sulfide having 1 to 20 carbon atoms.

10 Claims, 1 Drawing Sheet

(51) Int. Cl.
*G03F 7/004* (2006.01)
*G03F 7/20* (2006.01)

(58) Field of Classification Search
CPC ........ G03F 7/0382; G03F 7/322; G03F 7/039;
G03F 7/2053; G03F 7/2041; G03F 7/168;
G03F 7/325; G03F 7/038; C08F 20/38;
C08F 220/36; C08F 290/08; C08F 2/50;
B41C 1/1008; B41C 1/1016; B41C
2201/02; B41C 2201/06; B41C 2201/10;
B41C 2201/12; B41C 2201/14; B41C
2210/04; B41C 2210/08; B41C 2210/20;
B41C 2210/22; B41C 2210/24; C09D
133/08; C09D 4/00; C09D 11/101; C09D
11/30; C09D 11/322; C09D 11/40; C09D
11/107; B05D 3/067; B32B 7/02; G02B
5/22; G02B 1/11; G02B 5/08; B41J
11/00; B41J 11/002; B41J 2/01; B41J
2/2107; B65D 65/42; B41M 5/0023
See application file for complete search history.

(56) References Cited

U.S. PATENT DOCUMENTS

| 2002/0037479 | A1 | 3/2002 | Schwartzkopf et al. |
| 2005/0049325 | A1 | 3/2005 | Chisholm et al. |
| 2008/0200582 | A1 | 8/2008 | Craciun et al. |
| 2010/0055613 | A1* | 3/2010 | Aoshima ............... B41C 1/1008 430/270.1 |
| 2011/0269071 | A1 | 11/2011 | Fujimori et al. |
| 2012/0141940 | A1 | 6/2012 | Shimizu et al. |
| 2012/0315765 | A1 | 12/2012 | Nakajima et al. |
| 2015/0086927 | A1 | 3/2015 | Sugihara et al. |
| 2015/0340246 | A1 | 11/2015 | Woo et al. |
| 2016/0154306 | A1 | 6/2016 | Park et al. |
| 2017/0075218 | A1* | 3/2017 | Hatakeyama ........... G03F 7/168 |
| 2017/0137605 | A1* | 5/2017 | Suzuki ..................... C09D 4/00 |

FOREIGN PATENT DOCUMENTS

| JP | 2000-198966 A | 7/2000 |
| JP | 2003-342323 A | 12/2003 |
| JP | 2005-114848 A | 4/2005 |
| JP | 2005091618 A * | 4/2005 |
| JP | 2006-330655 A | 12/2006 |
| JP | 2009-186758 A | 8/2009 |
| JP | 2012-180503 A | 9/2012 |
| JP | 2012-230194 A | 11/2012 |
| JP | 2012-242556 A | 12/2012 |
| JP | 2015-087759 A | 5/2015 |
| JP | 2016-087759 A | 5/2016 |
| JP | 2016137666 A * | 8/2016 |
| JP | 2016-191884 A | 11/2016 |
| JP | 2017-097320 A | 6/2017 |
| KR | 10-2006-0103812 A | 10/2006 |
| KR | 10-2011-0120251 A | 11/2011 |
| KR | 10-2012-0049640 A | 5/2012 |
| KR | 10-2013-0009764 A | 1/2013 |
| KR | 10-2013-0026358 A | 3/2013 |
| KR | 10-2015-0033556 A | 4/2015 |
| KR | 10-2016-0063746 A | 6/2016 |
| TW | 200835944 A | 9/2008 |
| WO | 2008-073534 A1 | 6/2008 |
| WO | 2008-078953 A1 | 7/2008 |
| WO | 2010-109043 A1 | 9/2010 |
| WO | 2017-182441 A1 | 10/2017 |

OTHER PUBLICATIONS

English Translation of JP 2016-137666 A; Mika Honda; Published: Aug. 4, 2016 (Year: 2016).*

International Search Report and Written Opinion issued for International Application No. PCT/KR2018/008366 dated Nov. 5, 2018, 10 pages.

* cited by examiner

[FIG. 1]

PHOTORESIST COMPOSITION

CROSS-REFERENCE TO RELATED APPLICATION(S)

This application is a 35 U.S.C. § 371 National Phase Entry Application from PCT/KR2018/008366, filed on Jul. 24, 2018, and designating the United States, which claims the benefit of priority from Korean Patent Application No. 10-2017-0151809 filed on Nov. 14, 2017 and Korean Patent Application No. 10-2018-0085444 filed on Jul. 23, 2018 with the Korean Intellectual Property Office, the full disclosures of which are incorporated herein by reference.

TECHNICAL FIELD

The present invention relates to a photoresist composition.

BACKGROUND ART

To expand the application of a microfabrication technique of a FAB process, packaging technology is also changing into process technology for manufacturing high performance, thinner, and shorter packages. In particular, with the increase of semiconductor input/output terminals, the use of flip chips is expanded and FOWLP technology is introduced. Further, the TSV process enabling direct connection between chips is expanded for the purpose of minimizing signal delay. In this regard, the demand for solder bumps is increased and the technical development of a bump PR forming the same is very important.

In the case of a bump PR, the sensitivity and resolution in a thick film ranging from 10 μm to 100 μm should be excellent and metal bumps should be formed through a plating process. Therefore, pattern performance such as straightness, residue, footing, and notching properties should be good, and resistance to a plating solution should be excellent.

Accordingly, a chemically amplified photoresist is used in order to increase the sensitivity and resolution in a thick film. It is known that this composition includes a resin which is dissociated by an acid to increase its solubility in an alkali developing solution (hereinafter referred to as 'alkali-soluble resin'), a photosensitive acid generator (hereinafter referred to as 'photoacid generator'), an acid diffusion control agent, a corrosion inhibitor, and a specific dissolution inhibitor.

Meanwhile, a metal substrate is used for the plating process. In this case, if a conventional photoresist composition according to the related art is used, there is a disadvantage in that scum remains on the exposed portion after development.

Therefore, there is a need for research on techniques capable of improving the above disadvantage.

The present invention had been made to overcome the above-mentioned problems, and the invention provides a chemically amplified photoresist composition which can improve the compatibility and solubility for an alkali resin to prevent the occurrence of scum on the exposed portion during development that has usually been generated when using a conventional corrosion inhibitor, can suppress a leaching phenomenon where a low-molecular weight substance leaches out into a plating solution, and can eliminate the need to use a separate corrosion inhibitor.

In the present specification, a chemically amplified photoresist composition including an alkali-soluble resin including a (meth)acrylate-based resin containing a (meth)acrylate-based repeating unit in which a heterocyclic compound is substituted via a divalent functional group containing an alkylene sulfide having 1 to 20 carbon atoms is provided.

The heterocyclic compound may be at least one selected from the group consisting of a triazole-based compound, an imidazole-based compound, a thiadiazole-based compound, a triazine-based compound, and a benzimidazole-based compound.

In the present specification, a photoresist pattern prepared from the chemically amplified photoresist composition is also provided.

In addition, in the present specification, a method for preparing a photoresist pattern using the chemically amplified photoresist composition is provided.

Hereinafter, the chemically amplified photoresist composition, the photoresist pattern, and the method for preparing a photoresist pattern according to specific examples of the present invention will be described in more detail.

As used herein, the term "alkylene sulfide having 1 to 20 carbon atoms" may refer to a functional group in which a sulfur (S) element is attached to one side of an alkylene having 1 to 20 carbon atoms.

In addition, as used herein, the term "alkali-soluble resin" refers to a resin in which a protecting group is deprotected by light, thereby having an alkali-soluble property. The alkali-soluble resin is a polymer resin having an acid group protected by a protecting group, and the acid group may be, for example, a carboxyl group, a phenolic hydroxyl group, or the like.

According to one embodiment of the present invention, a chemically amplified photoresist composition including an alkali-soluble resin including a (meth)acrylate-based resin containing a (meth)acrylate-based repeating unit in which a heterocyclic compound is substituted via a divalent functional group containing an alkylene sulfide having 1 to 20 carbon atoms may be provided, wherein the heterocyclic compound is at least one selected from the group consisting of a triazole-based compound, an imidazole-based compound, a thiadiazole-based compound, a triazine-based compound, and a benzimidazole-based compound.

As the chemically amplified photoresist composition includes the alkali-soluble resin including a (meth)acrylate-based resin containing a (meth)acrylate-based repeating unit in which a heterocyclic compound is substituted via a divalent functional group containing an alkylene sulfide having 1 to 20 carbon atoms, it can improve the compatibility and solubility for the alkali resin to prevent the occurrence of scum on the exposed portion during development that has usually been generated when using a conventional corrosion inhibitor, can suppress a leaching phenomenon in which a low-molecular weight substance leaches out into a plating solution, and can exhibit a corrosion-inhibiting effect and thus eliminate the need to use a separate corrosion inhibitor.

Specifically, as described above, in the (meth)acrylate-based repeating unit included in the (meth)acrylate-based resin, a heterocyclic compound is substituted via a divalent functional group containing an alkylene sulfide having 1 to 20 carbon atoms, wherein the heterocyclic compound can not only exhibit a corrosion-inhibiting effect, but also forms a bulky structure by being substituted via a divalent functional group containing an alkylene sulfide having 1 to 20 carbon atoms in the (meth)acrylate-based repeating unit, thereby playing a role in preventing a leaching phenomenon in which a low-molecular weight substance leaches out into a plating solution.

Further, as the heterocyclic compound is substituted via a divalent functional group containing an alkylene sulfide having 1 to 20 carbon atoms in the (meth)acrylate-based repeating unit, the chemically amplified photoresist composition of the embodiment can improve compatibility and solubility, and even when used in a relatively small amount, it can implement an effect at an equivalent level or higher compared to when an additional corrosion inhibitor is added.

More specifically, when a specific heterocyclic compound is substituted at the terminal of the (meth)acrylate-based repeating unit included in the (meth)acrylate-based resin via an alkylene sulfide having 1 to 20 carbon atoms, more improved effects can be achieved in view of significantly reducing the occurrence of scum, compared to when the corrosion inhibitor is additionally added in an amount of 0.01 to 0.5% by weight relative to the chemically amplified photoresist.

Meanwhile, the (meth)acrylate-based repeating unit in which a heterocyclic compound is substituted via a divalent functional group containing an alkylene sulfide having 1 to 20 carbon atoms may include a repeating unit represented by Chemical Formula A below.

[Chemical Formula A]

In Chemical Formula A, $R_a$ is hydrogen or methyl, $R_b$ and $R_c$ are each a substituted or unsubstituted alkylene group having 1 to 10 carbon atoms, and X is a heterocyclic compound.

Meanwhile, the (meth)acrylate-based resin may contain 1 to 50% by weight of the (meth)acrylate-based repeating unit in which a heterocyclic compound is substituted via a divalent functional group containing an alkylene sulfide having 1 to 20 carbon atoms.

When the resin includes the (meth)acrylate-based repeating unit in which a heterocyclic compound is substituted via a divalent functional group containing an alkylene sulfide having 1 to 20 carbon atoms within the above range, the occurrence of scum can be more effectively prevented.

In contrast, when the (meth)acrylate-based resin includes the (meth)acrylate-based repeating unit in which a heterocyclic compound is substituted via a divalent functional group containing an alkylene sulfide having 1 to 20 carbon atoms in a higher content, a critical dimension (CD) of the lower part may be excessively widened after pattern development, or notching may occur at the bottom of the pattern in some cases.

Moreover, in addition to the (meth)acrylate-based repeating unit in which a heterocyclic compound is substituted via a divalent functional group containing an alkylene sulfide having 1 to 20 carbon atoms, the (meth)acrylate-based resin may further include a repeating unit derived from at least one compound selected from the group consisting of compounds represented by Chemical Formulae 1 to 8 below.

[Chemical Formula 1]

[Chemical Formula 2]

[Chemical Formula 3]

[Chemical Formula 4]

[Chemical Formula 5]

[Chemical Formula 6]

[Chemical Formula 7]

[Chemical Formula 8]

In Chemical Formulae 1 to 8, $R_1$ is hydrogen, a halogen, or an aliphatic group having 1 to 10 carbon atoms; and $n_1$ and $n_2$ are integers, wherein $1 \leq n_1 \leq 18$ and $1 \leq n_2 \leq 18$.

Meanwhile, the heterocyclic compound may be at least one selected from the group consisting of a triazole-based compound, an imidazole-based compound, a thiadiazole-based compound, a triazine-based compound, and a benzimidazole-based compound.

Specifically, the heterocyclic compound may be a compound containing one functional group selected from a thiol and an alkylene thiol, wherein the thiol may react with a double bond at the terminal of the (meth)acrylate-based repeating unit included in the (meth)acrylate-based resin as a part of the alkali-soluble resin and carry out a thiol-ene click reaction to form an alkylene sulfide having 1 to 20 carbon atoms, and may be bonded to the (meth)acrylate-based resin therethrough.

More specifically, the heterocyclic compound may be derived from one selected from compounds represented by Chemical Formulae 9 to 14 below.

[Chemical Formula 9]

[Chemical Formula 10]

[Chemical Formula 11]

[Chemical Formula 12]

[Chemical Formula 13]

[Chemical Formula 14]

In Chemical Formulae 9 to 14, $R_2$ to $R_{10}$ are each independently hydrogen, a halogen, a thiol (SH), an amine ($NH_2$), a hydroxy (OH), an alkylene having 1 to 20 carbon atoms, or an alkoxy group having 1 to 20 carbon atoms, $R_{11}$ is a functional group containing a thiol (SH) or a functional group containing an alkylene thiol having 1 to 20 carbon atoms, and $n_3$ and $n_4$ are integers wherein $1 \leq n_3 \leq 2$ and $1 \leq n_4 \leq 4$.

The thiol or the alkylene thiol contained in $R_{11}$ may react with a double bond at the terminal of the (meth)acrylate-based repeating unit to form an alkylene sulfide having 1 to 20 carbon atoms.

In the chemically amplified photoresist composition, the heterocyclic compound capable of performing the thiol-ene click reaction may be contained in an amount of 5 to 20 parts by weight based on 100 parts by weight of the total alkali-soluble resin.

When the heterocyclic compound is contained within the range of parts by weight described above, the sensitivity can be effectively increased with only a small equivalent weight, and thus the occurrence of scum on the exposed portion during development caused by excessive use of the heterocyclic compound may be prevented.

Specifically, when the compound is contained in an amount of less than parts by weight, the corrosion-inhibiting effect is hardly exhibited or is insignificant. When the compound is contained in an amount exceeding 20 parts by weight, the adhesion strength with the substrate may be lowered, and the photoresist film may not be formed properly.

Specifically, the alkali-soluble resin according to one embodiment of the present invention may include the (meth)

acrylate-based resin containing a (meth)acrylate-based repeating unit in which a heterocyclic compound is bonded via an alkylene sulfide having 1 to 20 carbon atoms.

The alkali-soluble resin according to another embodiment of the present invention may, in addition to the (meth) acrylate-based resin containing a (meth)acrylate-based repeating unit in which a heterocyclic compound is bonded via a divalent functional group containing an alkylene sulfide having 1 to carbon atoms, further include at least one selected from the group consisting of a (meth)acrylate-based resin different from said resin; a novolac-based resin; and a polyhydroxystyrene-based resin.

More specifically, an alkali-soluble resin is included in the chemically amplified photoresist composition according to the present invention, wherein a part of the alkali-soluble resin may be a (meth)acrylate-based resin containing a (meth)acrylate-based repeating unit in which a specific heterocyclic compound is bonded via an alkylene sulfide having 1 to 20 carbon atoms.

Specifically, the (meth)acrylate-based resin includes a double bond at the terminal of the (meth)acrylate-based repeating unit, which reacts with thiol at the terminal of a specific heterocyclic containing at least one functional group selected from a thiol and an alkylene thiol and causes the thiol-ene click reaction to form an alkylene sulfide having 1 to 20 carbon atoms, and thus the both are bonded therethrough.

Meanwhile, the alkali-soluble resin may further include a commonly known alkali-soluble resin other than the (meth) acrylate-based resin containing a (meth)acrylate-based repeating unit in which a heterocyclic compound is substituted via a divalent functional group containing an alkylene sulfide having 1 to 20 carbon atoms.

Specifically, the alkali-soluble resin may further include at least one selected from the group consisting of a different (meth)acrylate-based resin from the (meth)acrylate-based resin containing a (meth)acrylate-based repeating unit in which a heterocyclic compound is substituted via a divalent functional group containing an alkylene sulfide having 1 to 20 carbon atoms; a novolac-based resin; and a polyhydroxystyrene-based resin.

In addition, the chemically amplified photoresist composition for a thick film of one embodiment may further include at least one selected from a photoacid generator and a photoinitiator.

As the photoacid generator, those commonly used in the art can be used, and there is no particular limitation.

Such photoacid generator may include onium salts such as iodonium salts, sulfonium salts, diazonium salts, ammonium salts, and pyridinium salts; halogen group-containing compounds such as haloalkyl group-containing hydrocarbon compounds and haloalkyl group-containing heterocyclic compounds (halomethyltriazine derivatives, etc.); diazo ketone compounds such as 1,3-diketo-2-diazo compounds, diazobenzoquinone compounds, and diazonaphthoquinone compounds; sulfone compounds such as β-ketosulfone and β-sulfonylsulfone; sulfonic acid compounds such as alkyl sulfonates, haloalkyl sulfonates, aryl sulfonates, and iminosulfonates; and naphthalimide compounds such as N-(trifluoromethylsulfonyloxy)-1,8-naphthalimide, N-(p-toluenesulfonyloxy)-1,8-naphthalimide, N-(methylsulfonyloxy)-1,8-naphthalimide, and N-(camphorsulfonyloxy)-1,8-naphthalimide.

These compounds may be used singly or as a mixture of two or more.

In addition, the photoacid generator may be, for example, at least one selected from the group consisting of triarylsulfonium salts, diaryliodonium salts, sulfonate compounds, triphenylsulfonium triflate, triphenylsulfonium antimonate, diphenyliodonium triflate, diphenyliodonium antimonate, methoxydiphenyliodonium triflate, di-t-butyliodonium triflate, 2,6-dinitrobenzyl sulfonate, pyrogallol tris (alkylsulfonate), and succinimidyl triflate.

The photoinitiator may be one that is commonly used in the art, and is not particularly limited.

The photoinitiator is selected from, for example, benzophenone, aromatic α-hydroxy ketone, benzyl ketal, aromatic α-amino ketone, phenylglyoxylic acid ester, mono-acyl phosphine oxide, bis-acyl phosphine oxide, tris-acyl phosphine oxide, oxime ester derived from aromatic ketone, and/or oxime ester of a carbazole type.

Meanwhile, in one embodiment of the present invention, the photoinitiator may be used in the process of preparing the photoacid generator, or may be used by being added together with the photoacid generator after polymerizing the alkali-soluble resin.

Meanwhile, the chemically amplified photoresist composition of the embodiment may further include an acid diffusion control agent, a dissolution inhibitor, a solvent, etc., in addition to the above components.

The acid diffusion control agent may be included for the purpose of improving the resist pattern configuration, post-exposure stability, and the like, but is not particularly limited. For example, it may at least one selected from the group consisting of triethylamine, tripropyl amine, tribenzyl amine, trihydroxyethyl amine, and ethylene diamine.

Meanwhile, the dissolution inhibitor may be one that is commonly used in the art, and is not particularly limited.

Meanwhile, the solvent may be included for controlling the viscosity of the photoresist composition, but is not particularly limited. For example, the solvent may include ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, monomethyl ether, monoethyl ether, monopropyl ether, monobutyl ether, or a monophenyl ether of dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethoxyethyl acetate, methoxymethyl propionate, ethoxyethyl propionate, methyl 2-hydroxypropionate, ethyl 2-hydroxypropionate, ethyl 2-hydroxy-2-methylpropionate, methyl 2-hydroxy-3-methylbutanoate, 3-methoxybutyl acetate, and 3-methyl-3-methoxybutyl acetate; and aromatic hydrocarbons such as toluene and xylene.

These solvents may be used singly or as a mixture of two or more.

Meanwhile, according to another embodiment, a photoresist pattern prepared from the chemically amplified photoresist composition may be provided.

The photoresist pattern may be formed by using photoresist patterning methods and related devices, etc. that are commonly known in the art without particular limitation, except that the above-described chemically amplified photoresist composition is used.

Meanwhile, according to still another embodiment of the present invention, a method for preparing a photoresist pattern using the chemically amplified photoresist composition may be provided.

In the method for preparing a photoresist pattern, photoresist patterning methods and related devices, etc. that are commonly known in the art may be used without particular limitation, except that the above-described chemically amplified photoresist composition is used.

Specifically, the method for preparing a photoresist pattern may include a lamination step of laminating a thick film photoresist layer including the chemically amplified photoresist composition of the one embodiment on a support; an exposure step of irradiating the thick film photoresist layer with radiation including electromagnetic waves or particle beams; and a development step of developing the thick film photoresist layer after exposure to obtain a thick film resist pattern.

Advantageous Effects

As the photoresist composition of the present invention includes a (meth)acrylate-based resin containing a (meth)acrylate-based repeating unit in which a specific heterocyclic compound is substituted via a divalent functional group containing an alkylene sulfide having 1 to 20 carbon atoms in an alkali-soluble resin included in said composition, it can improve the compatibility and solubility for the alkali resin of the heterocyclic compound, thereby preventing the occurrence of scum on the exposed portion during development that has been usually generated when using a conventional corrosion inhibitor.

In addition, as the heterocyclic compound combines with the alkali-soluble resin containing a specific repeating unit to form a bulky structure, the photoresist composition can suppress a leaching phenomenon in which a low-molecular weight substance leaches out into a plating solution, and exhibits a corrosion-inhibiting effect and thus eliminates the need to use a separate corrosion inhibitor.

DETAILED DESCRIPTION OF THE EMBODIMENTS

Figure 1:
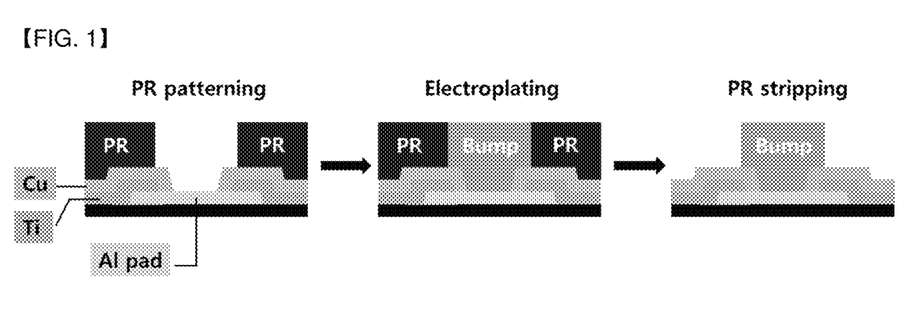
FIG. 1 illustrates the process for forming bumps using the photoresist composition of the present invention.

The present invention can make various modifications and take various forms, and thus specific embodiments are illustrated and described in detail below.

It should be understood, however, that the present invention is not intended to be limited to any particular disclosure form, but includes all modifications, equivalents, and alternatives falling within the spirit and scope of the invention.

Hereinafter, the action and effect of the present invention will be described by way of specific examples.

However, these examples are given for illustrative purposes only, and the scope of the invention is not intended to be limited by these examples.

Example 1: Preparation of Chemically Amplified Photoresist Composition Including Alkali Soluble Resin in which Heterocyclic Compound is Substituted Via Alkylene Sulfide Having 1 to 20 Carbon Atoms Tert-butyl methacrylate, methacrylic acid, 2-(allyloxy) ethyl methacrylate, dicyclopentanyl methacrylate (FA-513M), 1-dodecanethiol, and PGMEA (solvent) were added to a reactor in an amount of 95.58 g, 28.94 g, 85.86 g, 37.05 g, 2.19 g, and 320.09 g, respectively, to prepare a uniform solution.

The internal temperature of the solution was set to 65° C. under a nitrogen atmosphere, and then 1.62 g of AIBN was dissolved in 14.58 g of PGMEA and added to the solution.

After reacting for 18 hours, the polymerization reaction was terminated to obtain a resin represented by Chemical Formula 15 below (Mw: 25.2 k).

137.8 g of AIBN and 10.1 g of a corrosion inhibitor 1H-1,2,4-triazole-3-thiol represented by Chemical Formula 16 below were further added to the reactor.

The thiol-ene click reaction was carried out at 65° C., which was the same as the polymerization temperature, for 3 hours to prepare a compound having the structure of Chemical Formula 17 below, wherein the acrylic resin and the corrosion inhibitor were bonded via a functional group containing an alkylene sulfide.

When the reaction was completed, the temperature was lowered to room temperature, and the resultant was diluted with IPA and PGMEA and poured into water to remove a precipitate.

The polymer obtained by filtration was poured again into a mixture solvent of IPA and PGMEA, precipitated, filtered, and then dried in an oven at 40° C. for a day.

40 g of the acrylic resin (Mw: 25.1 k) represented by Chemical Formula 32 below, 4 g of the compound represented by Chemical Formula 17 below, which was subjected to a thiol-ene click reaction, and 6 g of poly(4-vinylphenol) (Mw: 25.1 k) were mixed. In addition, 3 g of the photoacid generator, 0.5 g of the acid diffusion inhibitor, and 50 g of PGMEA as a solvent were mixed thereto as additional additives, and the mixture was stirred at room temperature to prepare a uniform solution, thereby obtaining a chemically amplified photoresist composition.

[Chemical Formula 15]

[Chemical Formula 16]

[Chemical Formula 17]

[Chemical Formula 19]

Example 2

A resin represented by Chemical Formula 15 was obtained in the same manner as in Example 1. Then, the resin was placed into a reactor, and 137.8 g of AIBN and 10.0 g of a corrosion inhibitor 4H-imidazole-2-thiol represented by Chemical Formula 18 were further added thereto.

The thiol-ene click reaction was carried out at 65° C., which was the same as the polymerization temperature, for 3 hours to prepare a compound having the structure of Chemical Formula 19 below, wherein the acrylic resin and the corrosion inhibitor are bonded via the functional group containing an alkylene sulfide.

When the reaction was completed, the temperature was lowered to room temperature, and the resultant was diluted with IPA and PGMEA and poured into water to remove a precipitate.

The polymer obtained by filtration was poured again into a mixture solvent of IPA and PGMEA, precipitated, filtered, and then dried in an oven at 40° C. for a day.

40 g of the acrylic resin (Mw: 25.1 k) represented by Chemical Formula 32 below, 4 g of the compound represented by Chemical Formula 19 below, which was subjected to a thiol-ene click reaction, and 6 g of poly(4-vinylphenol) (Mw: 25.1 k) were mixed. In addition, 3 g of the photoacid generator, 0.5 g of the acid diffusion inhibitor (quencher), and 50 g of PGMEA as a solvent were mixed thereto as additional additives, and the mixture was stirred at room temperature to prepare a uniform solution, thereby obtaining a chemically amplified photoresist composition.

Example 3

A resin represented by Chemical Formula 15 was obtained in the same manner as in Example 1. Then, the resin was placed into a reactor, and 137.8 g of AIBN and 11.6 g of a corrosion inhibitor 1-methyl-4,5-dihydro-1H-imidazole-2-thiol represented by Chemical Formula 20 were further added thereto.

The thiol-ene click reaction was carried out at 65° C., which was the same as the polymerization temperature, for 3 hours to prepare a compound having the structure of Chemical Formula 21 below, wherein the acrylic resin and the corrosion inhibitor are bonded via the functional group containing an alkylene sulfide.

When the reaction was completed, the temperature was lowered to room temperature, and the resultant was diluted with IPA and PGMEA and poured into water to remove a precipitate.

The polymer obtained by filtration was poured again into a mixture solvent of IPA and PGMEA, precipitated, filtered, and then dried in an oven at 40° C. for a day.

40 g of the acrylic resin (Mw: 25.1 k) represented by Chemical Formula 32 below, 4 g of the compound represented by Chemical Formula 21 below, which was subjected to a thiol-ene click reaction, and 6 g of poly(4-vinylphenol) (Mw: 25.1 k) were mixed. In addition, 3 g of the photoacid generator, 0.5 g of the acid diffusion inhibitor, and 50 g of PGMEA as a solvent were mixed thereto as additional additives, and the mixture was stirred at room temperature to prepare a uniform solution, thereby obtaining a chemically amplified photoresist composition.

[Chemical Formula 18]

[Chemical Formula 20]

[Chemical Formula 21]

Example 4

A resin represented by Chemical Formula 15 was obtained in the same manner as in Example 1. Then, the resin was placed into a reactor, and 137.8 g of AIBN and 16.1 g of a corrosion inhibitor 4,6-dimercapto-1,3,5-triazin-2-ol represented by Chemical Formula 22 were further added thereto.

The thiol-ene click reaction was carried out at 65° C., which was the same as the polymerization temperature, for 3 hours to prepare a compound having the structure of Chemical Formula 23 below, wherein the acrylic resin and the corrosion inhibitor are bonded via the functional group containing an alkylene sulfide. When the reaction was completed, the temperature was lowered to room temperature, and the resultant was diluted with IPA and PGMEA and poured into water to remove a precipitate.

The polymer obtained by filtration was poured again into a mixture solvent of IPA and PGMEA, precipitated, filtered, and then dried in an oven at 40° C. for a day.

40 g of the acrylic resin (Mw: 25.1 k) represented by Chemical Formula 32 below, 4 g of the compound represented by Chemical Formula 23 below, which was subjected to a thiol-ene click reaction, and 6 g of poly(4-vinylphenol) (Mw: 25.1 k) were mixed. In addition, 3 g of the photoacid generator, 0.5 g of the acid diffusion inhibitor, and 50 g of PGMEA as a solvent were mixed thereto as additional additives, and the mixture was stirred at room temperature to prepare a uniform solution, thereby obtaining a chemically amplified photoresist composition.

[Chemical Formula 22]

[Chemical Formula 23]

Example 5

A resin represented by Chemical Formula 15 was obtained in the same manner as in Example 1. Then, the resin was placed into a reactor, and 137.8 g of AIBN and 14.5 g of a corrosion inhibitor 6-mercapto-1,3,5-triazine-2,4-diol represented by Chemical Formula 24 were further added thereto.

The thiol-ene click reaction was carried out at 65° C., which was the same as the polymerization temperature, for 3 hours to prepare a compound having the structure of Chemical Formula 25 below, wherein the acrylic resin and the corrosion inhibitor are bonded via the functional group containing an alkylene sulfide.

When the reaction was completed, the temperature was lowered to room temperature, and the resultant was diluted with IPA and PGMEA and poured into water to remove a precipitate.

The polymer obtained by filtration was poured again into a mixture solvent of IPA and PGMEA, precipitated, filtered, and then dried in an oven at 40° C. for a day.

40 g of the acrylic resin (Mw: 25.1 k) represented by Chemical Formula 32 below, 4 g of the compound represented by Chemical Formula 25 below, which was subjected to a thiol-ene click reaction, and 6 g of poly(4-vinylphenol) (Mw: 25.1 k) were mixed. In addition, 3 g of the photoacid generator, 0.5 g of the acid diffusion inhibitor, and 50 g of PGMEA as a solvent were mixed thereto as additional additives, and the mixture was stirred at room temperature to prepare a uniform solution, thereby obtaining a chemically amplified photoresist composition.

[Chemical Formula 24]

[Chemical Formula 25]

[Chemical Formula 27]

Example 6

A resin represented by Chemical Formula 15 was obtained in the same manner as in Example 1. Then, the resin was placed into a reactor, and 137.8 g of AIBN and 11.8 g of a corrosion inhibitor 1,3,4-thiadiazole-2-thiol represented by Chemical Formula 26 were further added thereto.

The thiol-ene click reaction was carried out at 65° C., which was the same as the polymerization temperature, for 3 hours to prepare a compound having the structure of Chemical Formula 27 below, wherein the acrylic resin and the corrosion inhibitor are bonded via the functional group containing an alkylene sulfide.

When the reaction was completed, the temperature was lowered to room temperature, and the resultant was diluted with IPA and PGMEA and poured into water to remove a precipitate.

The polymer obtained by filtration was poured again into a mixture solvent of IPA and PGMEA, precipitated, filtered, and then dried in an oven at 40° C. for a day.

40 g of the acrylic resin (Mw: 25.1 k) represented by Chemical Formula 32 below, 4 g of the compound represented by Chemical Formula 27 below, which was subjected to a thiol-ene click reaction, and 6 g of poly(4-vinylphenol) (Mw: 25.1 k) were mixed. In addition, 3 g of the photoacid generator, 0.5 g of the acid diffusion inhibitor, and 50 g of PGMEA as a solvent were mixed thereto as additional additives, and the mixture was stirred at room temperature to prepare a uniform solution, thereby obtaining a chemically amplified photoresist composition.

[Chemical Formula 26]

Example 7

A resin represented by Chemical Formula 15 was obtained in the same manner as in Example 1. Then, the resin was placed into a reactor, and 137.8 g of AIBN and 14.6 g of a corrosion inhibitor 5-diazenyl-1,3,4-thiadiazole-2-thiol represented by Chemical Formula 28 were further added thereto.

The thiol-ene click reaction was carried out at 65° C., which was the same as the polymerization temperature, for 3 hours to prepare a compound having the structure of Chemical Formula 29 below, wherein the acrylic resin and the corrosion inhibitor are bonded via the functional group containing an alkylene sulfide.

When the reaction was completed, the temperature was lowered to room temperature, and the resultant was diluted with IPA and PGMEA and poured into water to remove a precipitate.

The polymer obtained by filtration was poured again into a mixture solvent of IPA and PGMEA, precipitated, filtered, and then dried in an oven at 40° C. for a day.

40 g of the acrylic resin (Mw: 25.1 k) represented by Chemical Formula 32 below, 4 g of the compound represented by Chemical Formula 29 below, which was subjected to a thiol-ene click reaction, and 6 g of poly(4-vinylphenol) (Mw: 25.1 k) were mixed. In addition, 3 g of the photoacid generator, 0.5 g of the acid diffusion inhibitor, and 50 g of PGMEA as a solvent were mixed thereto as additional additives, and the mixture was stirred at room temperature to prepare a uniform solution, thereby obtaining a chemically amplified photoresist composition.

[Chemical Formula 28]

-continued

[Chemical Formula 29]

[Chemical Formula 31]

Example 8

A resin represented by Chemical Formula 15 was obtained in the same manner as in Example 1. Then, the resin was placed into a reactor, and 137.8 g of AIBN and 15.0 g of a corrosion inhibitor 1,3,4-thiadiazole-2,5-dithiol represented by Chemical Formula 30 were further added thereto.

The thiol-ene click reaction was carried out at 65° C., which was the same as the polymerization temperature, for 3 hours to prepare a compound having the structure of Chemical Formula 31 below, wherein the acrylic resin and the corrosion inhibitor are bonded via the functional group containing an alkylene sulfide.

When the reaction was completed, the temperature was lowered to room temperature, and the resultant was diluted with IPA and PGMEA and poured into water to remove a precipitate.

The polymer obtained by filtration was poured again into a mixture solvent of IPA and PGMEA, precipitated, filtered, and then dried in an oven at 40° C. for a day.

40 g of the acrylic resin (Mw: 25.1 k) represented by Chemical Formula 32 below, 4 g of the compound represented by Chemical Formula 31 below, which was subjected to a thiol-ene click reaction, and 6 g of poly(4-vinylphenol) (Mw: 25.1 k) were mixed. In addition, 3 g of the photoacid generator, 0.5 g of the acid diffusion inhibitor, and 50 g of PGMEA as a solvent were mixed thereto as additional additives, and the mixture was stirred at room temperature to prepare a uniform solution, thereby obtaining a chemically amplified photoresist composition.

[Chemical Formula 30]

Comparative Example 1

44 g of the acrylic resin (Mw: 25.1 k) represented by Chemical Formula 32 below, as an alkali-soluble resin, 6 g of poly(4-vinylphenol) (Mw: 25.1 k), and 3 g of trifluoromethylsulfonyloxy-1,8-naphthalimide represented by Chemical Formula 33 below, as a photoacid generator, were mixed. Then 0.5 g of the acid diffusion inhibitor and 50 g of PGMEA as a solvent were mixed thereto as additional additives, and the mixture was stirred at room temperature to prepare a uniform solution, thereby obtaining a chemically amplified photoresist composition.

[Chemical Formula 32]

[Chemical Formula 33]

Experimental Examples

Semiconductor elements were patterned in the following manner using each of photoresist compositions of the examples and the comparative example.

The photoresist composition was spin-coated on a 4-inch Si wafer coated with copper (Cu) in a thickness of about 2000 Å, and then dried at 120° C. for 4 minutes to form a photoresist layer having a thickness of about 50 μm.

The wafer was exposed to light using an i-line stepper (equipped with a photomask on which hole patterns in the size of about 10, 20, 30, 40, and 50 μm are formed).

The exposed wafer was dried at 90° C. for 3 minutes, and then developed for 240 seconds using a developing solution (aqueous solution of about 2.38 wt % tetramethylammonium hydroxide).

After patterning, the physical properties of the photoresist compositions were evaluated in the following manner.

(1) Sensitivity (Amount of Exposure, mJ/cm$^2$)

The photoresist compositions prepared in Examples 1 to 8 and Comparative Example 1 were spin-coated on a substrate and dried on a hot plate at 120° C. for 4 minutes, then exposed to light using a step mask, and additionally dried on a hot plate at 90° C. for 3 minutes and developed in an aqueous solution of tetramethylammonium hydroxide (TMAH).

The amount of exposure with the same CD size of the step mask pattern and the photoresist (PR) pattern was evaluated as sensitivity.

(2) Occurrence of Footing at the Bottom of Pattern

The photoresist compositions prepared in Examples 1 to 8 and Comparative Example 1 were spin-coated on a substrate and dried on a hot plate at 120° C. for 4 minutes, then exposed to light using a step mask, and additionally dried on a hot plate at 100° C. for 2 minutes and developed in an aqueous solution of tetramethylammonium hydroxide (TMAH).

The value at which the hole diameter at the bottom was reduced from the hole diameter at the top of the thick resist pattern was measured as the footing length.

The footing characteristics of PR were evaluated based on the following criteria.

◎: Footing length of greater than 0 nm and less than or equal to 200 nm

○: Footing length of greater than 200 nm and less than or equal to 500 nm

Δ: Footing length of greater than 500 nm and less than or equal to 1 μm

X: Footing length of greater than 1 μm (3) Evaluation on Occurrence of Scum (Presence or Absence of Residue)

A thick film resist pattern was prepared in the same manner as for the occurrence of footing at the bottom of the pattern, and the presence or absence of scum on the development portion was observed and used as the index for evaluating the developing property. The developing property was evaluated based on the following criteria.

◎: No occurrence of scum

Δ: Occurrence of some scum around pattern

X: Occurrence of scum on the entire development portion (4) Resistance to Plating Solution The photoresist compositions prepared in Examples 1 to 8 and Comparative Example 1 were coated onto a substrate using a spin coater, and then a resist film formed by processes such as prebake and post-bake was immersed in a Cu plating solution at room temperature for 24 hours to examine any changes in the thickness of the resist film.

The rate of change in thickness was evaluated based on the following criteria.

◎: Rate of change in thickness less than 1%

○: Rate of change in thickness greater than 1% and less than or equal to 3%

Δ: Rate of change in thickness greater than 3% and less than or equal to 10%

X: Rate of change in thickness greater than 10%

TABLE 1

| | Sensitivity (mJ/cm$^2$) | Footing | Occurrence of scum | Resistance to plating solution |
|---|---|---|---|---|
| Example 1 | 350 | ○ | ◎ | ○ |
| Example 2 | 310 | ○ | ◎ | ○ |
| Example 3 | 340 | ○ | ◎ | ○ |
| Example 4 | 280 | ○ | ◎ | ○ |
| Example 5 | 270 | ◎ | ◎ | ◎ |
| Example 6 | 290 | ◎ | ◎ | ◎ |
| Example 7 | 380 | ○ | ◎ | ◎ |
| Example 8 | 390 | ○ | ◎ | ◎ |
| Comparative Example 1 | 550 | X | X | X |

From the results shown in Table 1, it can be confirmed that the photoresist compositions of Examples 1 to 8 of the present invention which included the (meth)acrylate-based resin containing the (meth)acrylate-based repeating unit in which a specific heterocyclic compound is substituted via a divalent functional group containing an alkylene sulfide having 1 to 20 carbon atoms, as a part of the alkali soluble resin, exhibited excellent sensitivity, had no occurrence of footing and scum, and also showed excellent resistant to the plating solution as the leaching phenomenon was suppressed.

The invention claimed is:

1. A chemically amplified photoresist composition, comprising an alkali-soluble resin including a (meth)acrylate-based resin containing a (meth)acrylate-based repeating unit, wherein the (meth)acrylate-based repeating unit includes a heterocyclic compound that is substituted via a divalent functional group containing an alkylene sulfide having 1 to 20 carbon atoms, wherein the heterocyclic compound is at least one selected from the group consisting of a triazole-based compound, an imidazole-based compound, a thiadiazole-based compound, a triazine-based compound, and a benzimidazole-based compound, and wherein the (meth)acrylate-based repeating unit includes a repeating unit represented by Chemical Formula A below:

[Chemical Formula A]

$$\left(\begin{array}{c}\text{Ra}\\\end{array}\right)$$

(structure with Ra substituent on backbone, ester group O=C-O-Rb-O-Rc-S-X)

wherein, in Chemical Formula A,

Ra is hydrogen or methyl,

Rb and Rc are each a substituted or unsubstituted alkylene group having 1 to 10 carbon atoms, and X is the heterocyclic compound.

2. The chemically amplified photoresist composition of claim 1,
   wherein the (meth)acrylate-based resin contains 1 to 50% by weight of the (meth)acrylate-based repeating unit.

3. The chemically amplified photoresist composition of claim 1,
   wherein the (meth)acrylate-based resin further contains a repeating unit derived from at least one compound selected from the group consisting of compounds represented by Chemical Formulae 1 to 8 below:

[Chemical Formula 1]

[Chemical Formula 2]

[Chemical Formula 3]

[Chemical Formula 4]

-continued

[Chemical Formula 5]

[Chemical Formula 6]

[Chemical Formula 7]

[Chemical Formula 8]

wherein, in Chemical Formulae 1 to 8, $R_1$ is hydrogen, a halogen, or an aliphatic group having 1 to 10 carbon atoms; and

$n_1$ and $n_2$ are integers, wherein $1 \leq n_1 \leq 18$ and $1 \leq n_2 \leq 18$.

4. The chemically amplified photoresist composition of claim 1,
   wherein the heterocyclic compound is derived from one selected from compounds represented by Chemical Formulae 9 to 14 below:

[Chemical Formula 9]

-continued

[Chemical Formula 10]

[Chemical Formula 11]

[Chemical Formula 12]

[Chemical Formula 13]

[Chemical Formula 14]

wherein, in Chemical Formulae 9 to 14, $R_2$ to $R_{10}$ are each independently hydrogen, a halogen, a thiol (SH), an amine ($NH_2$), a hydroxy (OH), an alkylene having 1 to 20 carbon atoms, or an alkoxy group having 1 to 20 carbon atoms, $R_{11}$ is a functional group containing a thiol (SH) or a functional group containing an alkylene thiol having 1 to 20 carbon atoms, and $n_3$ and $n_4$ are integers, wherein $1 \leq n_3 \leq 2$ and $1 \leq n_4 \leq 4$.

5. The chemically amplified photoresist composition of claim 1,
wherein the alkylene sulfide having 1 to 20 carbon atoms is formed by a thiol-ene click reaction of a thiol group in the heterocyclic compound with a double bond at a terminal of the (meth)acrylate-based repeating unit.

6. The chemically amplified photoresist composition of claim 1,
wherein the alkali-soluble resin further includes at least one selected from the group consisting of a (meth)acrylate-based resin different from the (meth)acrylate-based resin containing a (meth)acrylate-based repeating unit in which a heterocyclic compound is substituted via a divalent functional group containing an alkylene sulfide having 1 to 20 carbon atoms; a novolac-based resin; and a polyhydroxystyrene-based resin.

7. The chemically amplified photoresist composition of claim 1,
further comprising at least one selected from a photoacid generator and a photoinitiator.

8. A method for preparing a photoresist pattern,
the method comprises:
a lamination step of laminating a thick film photoresist layer comprising the chemically amplified photoresist composition of claim 1 on a support;
an exposure step of irradiating the thick film photoresist layer with radiation including electromagnetic waves or particle beams; and
a development step of developing the thick film photoresist layer after exposure to obtain a thick film resist pattern.

9. The chemically amplified photoresist composition of claim 7,
further comprising at least one selected from an acid diffusion control agent and a dissolution inhibitor.

10. A photoresist pattern prepared by the method of claim 8.

* * * * *